United States Patent [19]

Horinouchi et al.

[11] Patent Number: 5,567,953
[45] Date of Patent: Oct. 22, 1996

[54] PHOTO INTERRUPTER AND A METHOD OF MANUFACTURING THE SAME

[75] Inventors: Teruhiko Horinouchi, Kashihara; Nobumasa Ono, Hashimoto, both of Japan

[73] Assignee: Sharp Kabushiki Kaisha, Osaka, Japan

[21] Appl. No.: 363,815

[22] Filed: Dec. 27, 1994

[30] Foreign Application Priority Data

Dec. 27, 1993 [JP] Japan .................................. 5-332509

[51] Int. Cl.⁶ .................................................. G02B 27/00
[52] U.S. Cl. ............................ 250/551; 250/239; 257/81
[58] Field of Search .................................. 250/239, 551; 257/81, 82, 698

[56] References Cited

U.S. PATENT DOCUMENTS 4,933,726  6/1990  Soejima et al. .
5,304,812  4/1994  Tani et al. ................................ 250/551

FOREIGN PATENT DOCUMENTS 3203274  9/1991  Japan .
421114  5/1992  Japan .

OTHER PUBLICATIONS

Patent Abstracts of Japan, E. field, vol. 13, No. 38, Jan. 27, 1989 Abstract of JP A–63236374.
Patent Abstracts of Japan, E field, vol. 13, No. 62, Feb. 13,1989 Abstract of JP A–63250182.
Patent Abstracts of Japan, E Field, vol. 10, No. 272, Sep. 16, 1986 Abstract of JP A–61093682.

Primary Examiner—Georgia Y. Epps
Assistant Examiner—Jacqueline M. Steady

[57] ABSTRACT

A photo interrupter includes a lead frame having a light-emitting element and a light-receiving element provided thereon and having a lead pattern for connecting input/output terminals of both the light-emitting element and said light-receiving element to the outside at a converged connector-jointing portion. Both the light-emitting element and the light-receiving element are provided on the common lead frame which is connected directly to a connector for connecting to the outside. A casing for holding the light-sensing parts is composed of a thermoplastic resin and provided with melt pins joining the connector and the lead frame to the casing.

14 Claims, 8 Drawing Sheets

PHOTO INTERRUPTER AND A METHOD OF MANUFACTURING THE SAME

BACKGROUND OF THE INVENTION (1) Field of the Invention

The present invention relates to a photo interrupter in which a light-emitting element and a light-receiving element are disposed opposing each other to create an object passage whereby an object which passes therebetween is detected.

(2) Description of the Prior Art

FIG. 1 is a constructional example of a prior art photo interrupter. The construction of this photo interrupter will be explained in the following steps of the manufacturing procedure.

A light-emitting-side transparent resin part 60 is formed such that a light-emitting element, after mounted on a frame for a light-emitting element and bonded thereon, is molded with a light transmissive resin material. Similarly, a light-receiving-side transparent resin part 61 is formed such that a light-receiving element, after mounted on a frame for a light-receiving element and bonded thereon, is molded with a light transmissive resin material. A lead 60a from the light-emitting-side transparent resin part 60 and leads 61a and 61b from the light-receiving-side transparent resin part 61 are soldered on a print board 62 so as to form a passage 63 to allow an object to pass through. A connector 64 for electrically connecting the light-emitting element and light-receiving element with the outside is fixedly joined with solder 65 to the print board 62. After checking the soldering, the print board 62 is fitted into a casing 66 having hooks 66a and 66b in the bottom thereof. These hooks 66a and 66b are used to assure the fixing between the print board 62 and the casing 66 itself.

As stated above, many components, e.g. the light-emitting-side transparent resin part 60, the light-receiving-side transparent resin part 61, the print board 62, the connector 64 and the casing 66 as in the above case, have been required for such a conventional photo interrupter. For this reason, the prior art devices disadvantageously took much time and labor for assembling. Further, there were quite a few places to be soldered in assembling; therefore, examination of the soldering was required to maintain reliability and quality. Since the connection between the print board 62 and the connector 64 is supported by the strength of the solder, reliable and rigid soldering is required.

Further, fastenings with complicated structures such as hooks 66a, 66b were used for fixing, so that the fixing work not only took much time and labor but also posed a high likelihood of breaking.

SUMMARY OF THE INVENTION

It is therefore an object of the present invention to provide a photo interrupter which is reduced in cost by cutting down the number of parts and simplifying the operation of assembling and which has improved reliability in operation as a part.

The present invention has been achieved to attain the above object, and the gist of the present invention can be stated as follows.

A photo interrupter of the present invention comprises: a light-emitting element; a light-receiving element; a lead frame having both the light-emitting element and the light-receiving element provided thereon and having a lead pattern for connecting input/output terminals of both the light-emitting element and the light-receiving element to the outside at a converged connector-jointing portion; a connector to be connected to the connector-jointing portion in the lead frame; and a casing covering the light-emitting element, the light-receiving element and the lead frame.

In this construction, any of the following features are effective: the casing has joint portions for joining the casing with the connector; and the casing has joint portions consisting of a thermoplastic resin in places adjacent to other components such as the lead frame, the connector and the like and the joint portions are heat-pressed when the other components are joined to the casing. Further, in the device having any of the above features, it is effective that the lead frame is composed of a conductive material having rust-resistance and the lead frame is joined to the connector by welding.

Next, a method of manufacturing a photo interrupter according to the present invention includes the steps of:

when use is made of a lead frame having a lead pattern for connecting a light-emitting element and a light-receiving element provided thereon so that input/output terminals of the elements may be connected to the outside at a converged site, providing a light-emitting element and a light-receiving element on the lead frame;

molding the elements with a light transmissive resin;

bending the lead frame so that the light-emitting element and the light-receiving element are opposed to each other;

connecting a connector to the lead frame by welding;

holding the lead frame with the connector connected in a casing; and joining the lead frame with the casing by heat-pressing.

Thus, the photo interrupter of the present invention, both the light-emitting element and the light-receiving element are provided on the common lead frame. Since this lead frame has a lead pattern for connecting input/output terminals of both the light-emitting element and the light-receiving element to the outside at a converged connector-jointing portion, a complete electric connection for the photo interrupter can be done by only connecting a connector to the connector-jointing portion in the lead frame in which the light emitting element and the light-receiving element are provided. In this way, the lead frame with the light-emitting element and light-receiving element provided thereon has a complete lead pattern to the connector, therefore, it is possible to directly joint the connector to the lead frame, resulting in reduced places to be interconnected.

In the photo interrupter of the present invention, the connector is joined to the casing, so that the connector is supported by the casing. An increased number of points for supporting makes the holding state rigid.

In the photo interrupter of the present invention, since the joint portions are composed of a thermoplastic resin, it is possible to easily join the thermoplastic resin part with the other parts (such as the lead frame and the connector) by heat-pressing.

In the photo interrupter of the present invention, since the lead frame is composed of a conductive material having rust-resistance, no plating for providing rust-resistance is required for the lead frame. Since the connection between the lead frame and the connector is done by welding, any plating which would have been required for soldering is unnecessary. In the case of the conventional photo interrupter requiring a print board, since the print board has an insulating layer on the surface thereof, it is impossible to weld the board with a connector. That is, in the present invention, the integration of the lead frame enables welding connection, whereby it is possible to omit the plating of the lead frame.

On the other hand, in accordance with the method of manufacturing a photo interrupter of the present invention, a light-emitting element and a light-receiving element are both provided on a single lead frame and molded with a resin. The thus formed lead frame is bent, jointed with a connector and housed by a casing. In the course of the operation steps, since both the light-emitting element and the light-receiving element are processed as provided on the lead frame, work steps such as molding, interconnecting etc. can be reduced. Since the lead frame used here has a converged site on one side for collecting the input/output terminals of the light-emitting element and the light-receiving element, it is possible to join the lead frame with the connector at the converged site all at once.

DESCRIPTION OF THE PREFERRED EMBODIMENTS

An embodiment of the present invention will hereinafter be described with reference to the accompanying drawings.

Figure 2A:
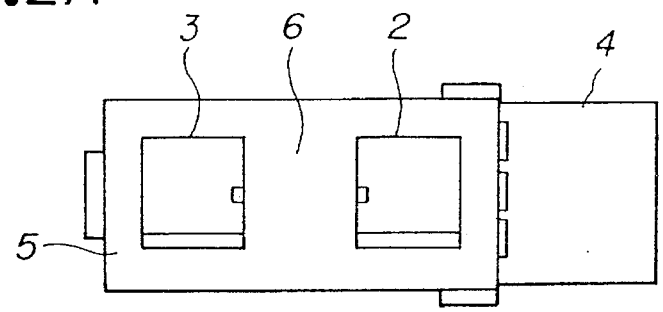
FIG. 2A is a plan view showing a configuration of a photo interrupter in accordance with an embodiment of the present invention.
Figure 2B:
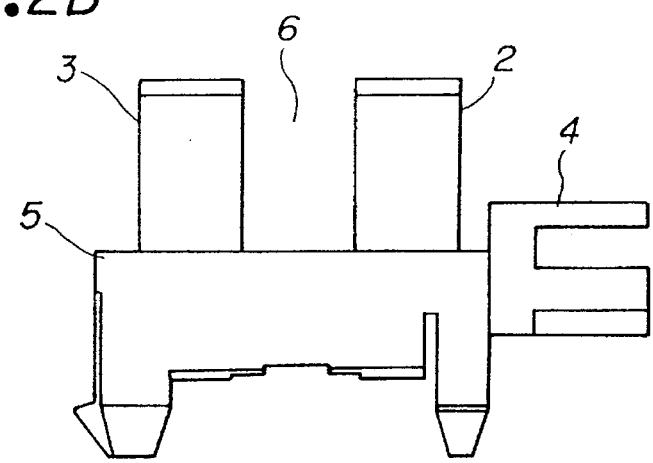
FIG. 2B is a front view showing a configuration of a photo interrupter in accordance with an embodiment of the present invention.
Figure 2C:
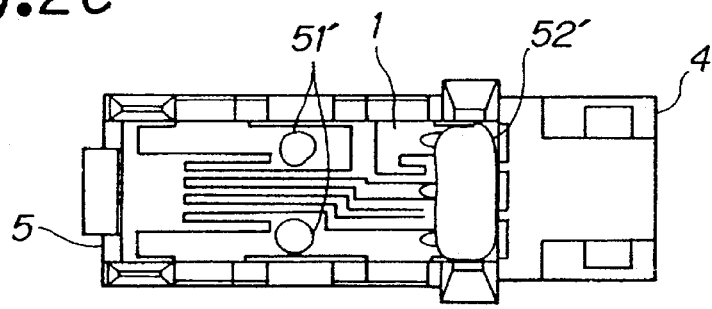
FIG. 2C is a bottom view showing a configuration of a photo interrupter in accordance with an embodiment of the present invention.
Figure 2D:
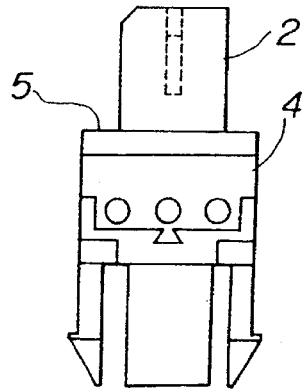
FIG. 2D is a right-side view showing a configuration of a photo interrupter in accordance with an embodiment of the present invention.
Figure 2E:
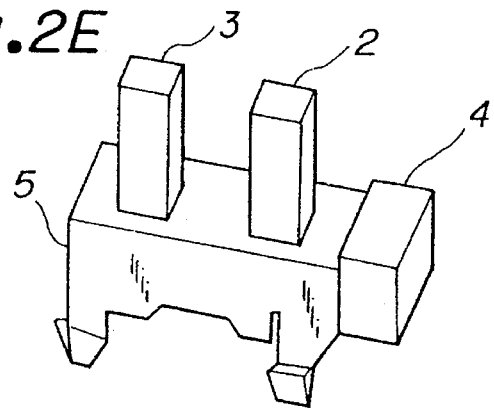
FIG. 2E is a perspective appearance view showing a configuration of a photo interrupter in accordance with an embodiment of the present invention.

Figs.2A to 2E are views showing a photo interrupter in accordance with an embodiment of the present invention. FIGS.2A, 2B, 2C and 2D are plan, front, bottom and right-side views of the embodiment, respectively. FIG. 2E is a perspective appearance view of the same embodiment. FIGS. 3 through 10 are views of the features of parts of the same photo interrupter and the states under manufacturing the same.

In FIGS. 2A through 2E, a light-emitting portion 2 and a light-receiving portion 3 are housed by a casing 5 and disposed opposing each other with an object passage 6 in between. A connector 4 is provided projected from the side of the light-emitting portion 2. The configuration of this photo interrupter will be now described in the following steps of the manufacturing procedure.

Figure 3:
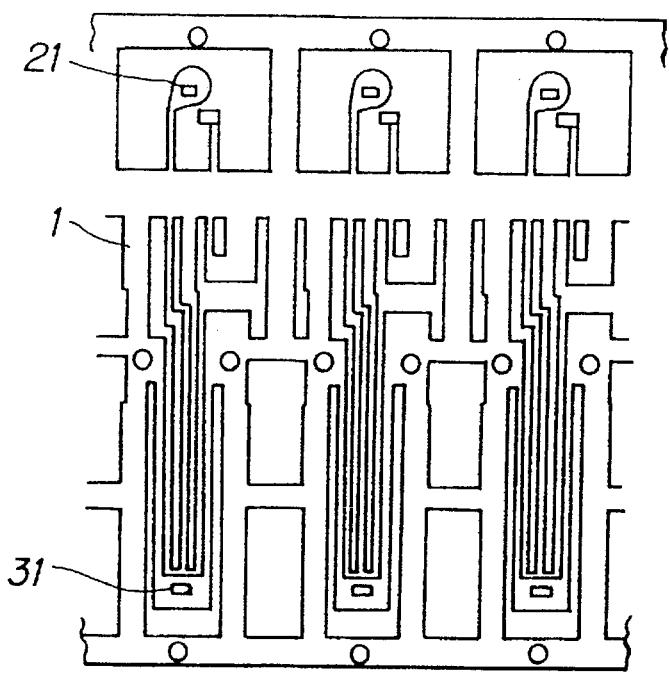
FIG. 3 is a plan view showing lead frames built in with light-emitting elements and light-receiving elements.

FIG. 3 is a view showing a lead frame on which light-emitting elements and light-receiving elements are provided. A lead frame 1 is composed of a nickel alloy (e.g., 42 alloy) having a high strength and rust-resistance. Use of a nickel alloy material provides a good weather resistance for the lead frame without necessity of rust-resistance plating on the surface of the lead frame. A light-emitting element 21 as well as a light-receiving element 31 is provided on each lead frame 1 (for one photo interrupter), fixed and wire-bonded. The structure of the lead portion in the lead frame 1 will be further described later.

Figure 4:
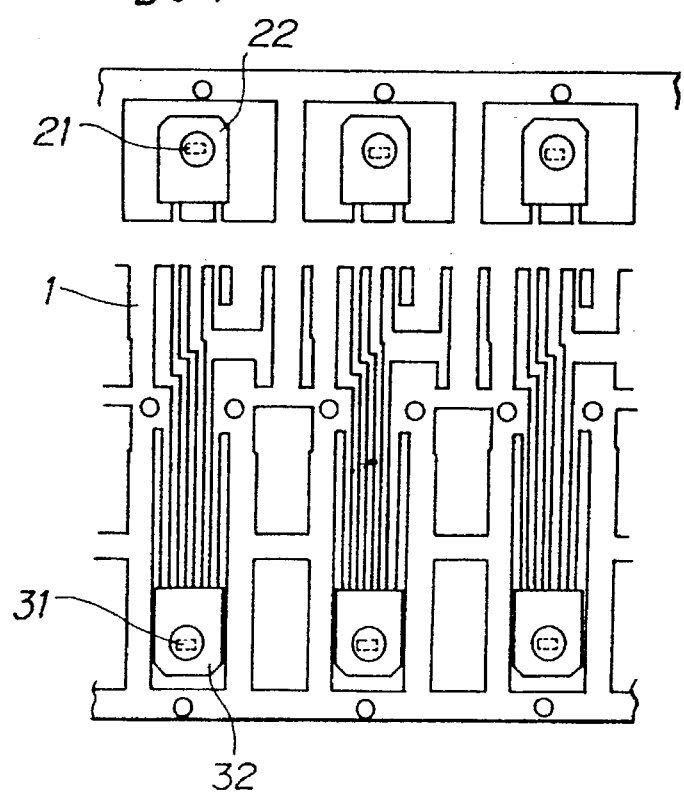
FIG. 4 is a plan view showing lead frames with light-emitting elements and light-receiving elements molded.
Figure 5:
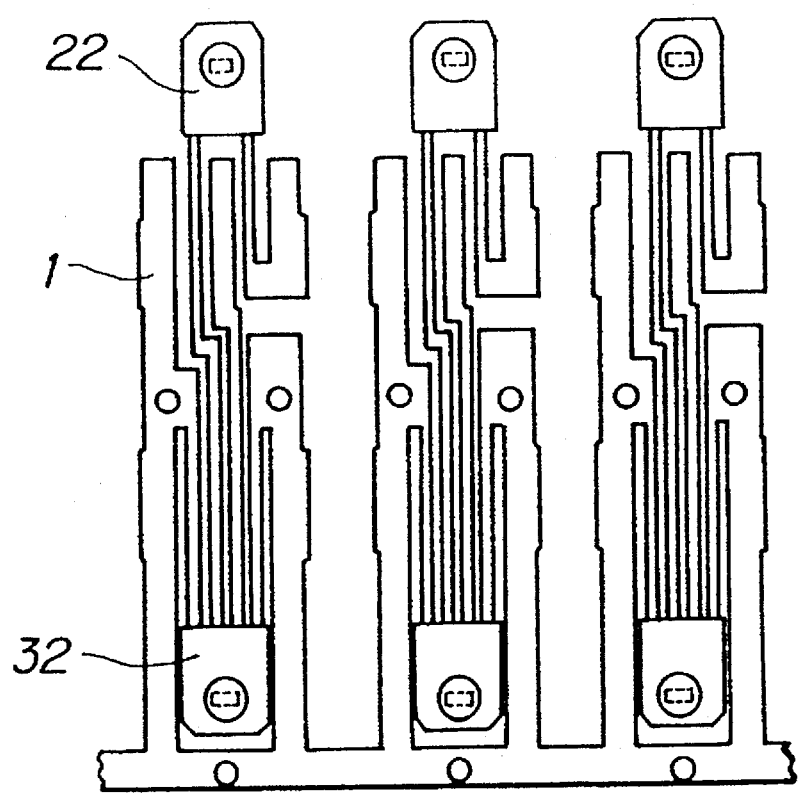
FIG. 5 is a plan view showing lead frames after unnecessary parts are removed by die cutting.

After the light-emitting element 21 and the light-receiving element 31 have been bonded as stated, the elements 21 and 31 are molded as shown in FIG. 4 with a transparent resin (mold resin 22 and 32). At the time, the elements 21 and 31 are designed to be provided on the common frame in the present invention, unlike the prior art configuration in which the light-emitting element and the light-receiving element are provided separately, therefore, it is possible to mold both the elements 21 and 31 at a single step. Accordingly, operation steps can be reduced in number and process cost as well as material cost can be reduced. Thereafter, the lead frame 1 is die-cut (by tie bar cut), unnecessary parts being removed as shown in FIG. 5, so as to be checked on performances and characteristics.

Figure 6A:
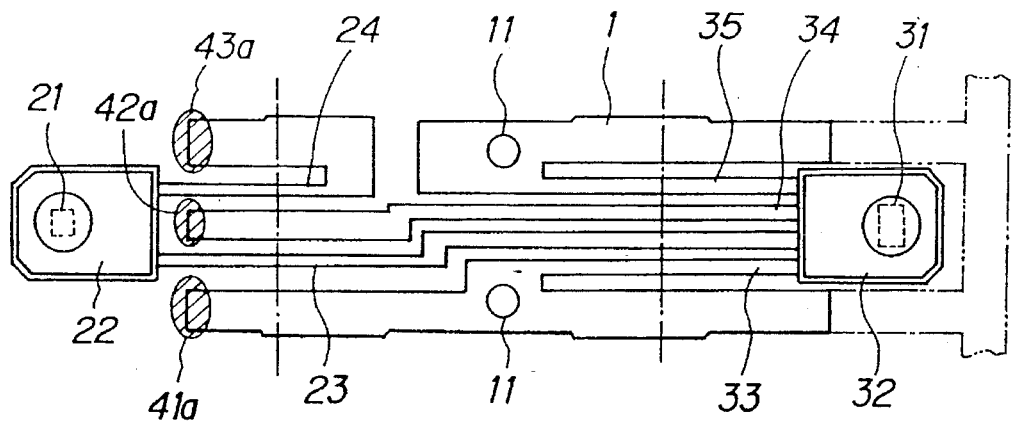
FIG. 6A is a plan view showing a lead frame built in with a light-emitting element and a light-receiving element.
Figure 6B:
FIG. 6B is a front view showing a lead frame built in with a light-emitting element and a light-receiving element.
Figure 6C:
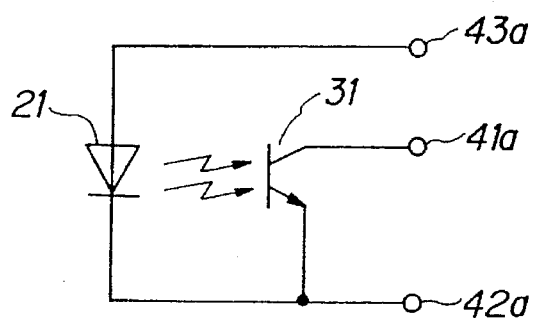
FIG. 6C is a diagram showing an equivalent circuit to the photo interrupter shown in Figs.6A and 6B.

Referring now to FIGS. 6A to 6C, the construction of the lead frame 1 will be described. FIGS. 6A and 6B are plan and front views showing the lead frame with the light-emitting element and light-receiving element provided. FIG. 6C is a diagram showing an equivalent circuit to the photo interrupter.

In FIG. 6A, chained lines indicate bending lines along which the frame is bent upright so that molded resin portions 22 and 23 of the light-emitting element and the light-receiving element are opposed to each other. Reference numerals 41a to 43a with hatching designate connecting parts to be connected to pins 41b to 43b of the connector 4, which will be detailed later. The connecting parts in this embodiment are brought together on the side of the light-emitting portion 2. Here, the connecting parts 41a to 43a may be formed on the light-receiving side or in any other site as long as they are gathered so that the connector 4 can be joined at one place. Although an LED is used as the light-emitting element and a photo transistor is used as the light-receiving element in this specific embodiment, other device elements may be used. For example, a photodiode or photo IC is applicable as the light-receiving element. In the case, the parts should be arranged in such a manner that input/output terminals of the light-emitting element and the light-receiving element can be connected to a single connector.

A collector terminal 33 of the light-receiving element 31 is connected to the connecting part 41a for outputting a detection signal to the connector. The emitter terminal 34 is connected to the connecting part 42a for ground in the connector as well as to a cathode terminal 23 of the light-emitting element 21 via a wire. In this embodiment, although the emitter terminal 34 is wire-connected with the cathode terminal 23, the connection may be done through the lead frame itself. An anode terminal 24 of the light-emitting element 21 is connected to the connecting part 43a for input. A base terminal 35 of the light-receiving element 31 is open.

Figure 7:
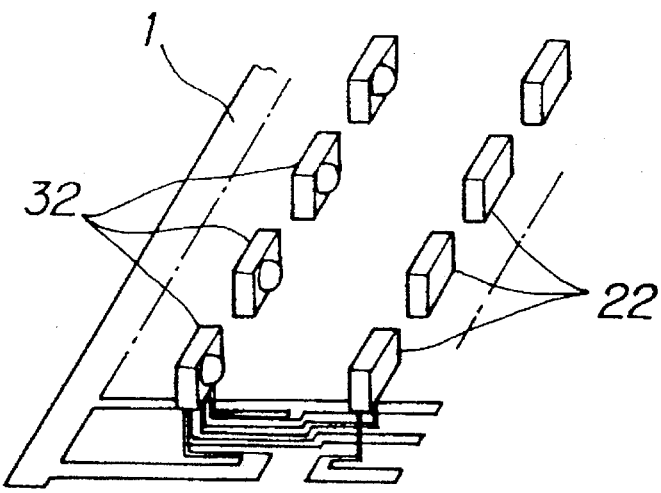
FIG. 7 is a perspective view showing a state in which the light-emitting element portions and light-receiving element portions shown in FIG. 6A are bent upright so as to oppose each other.

Next, a bending step follows. The lead frame is bent along the chained lines shown in FIG. 6A as required, so that the light-emitting element 21 and the light-receiving element 31 are made upright opposing each other as shown in FIG. 7. In this case, the outmost leads and the connecting part 42a for ground will not be bent. Thus, a light sensing part composed of the light-emitting portion and the light-receiving portion is completed.

Figure 8:
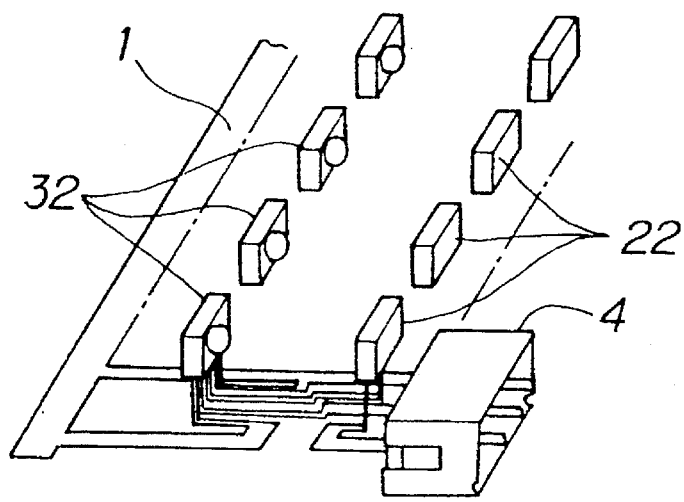
FIG. 8 is a perspective view showing a state of a photo interrupter with a connector fixed.
Figure 9:
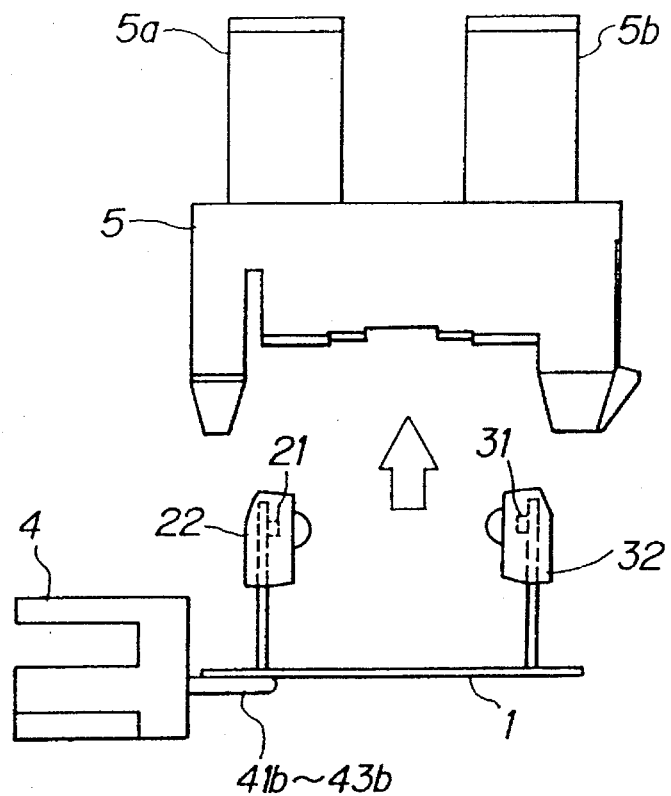
FIG. 9 is a plan view showing a state of a photo interrupter with a connector fixed.

Subsequently, the connecting pins 41b to 43b are mated with the connector parts 41a to 43a, respectively, so that the lead frame 1 is joined to the connector 4. In this embodiment, this joint is performed by spot-welding. As a result, the connecting work is markedly simplified because there is no need for plating the lead frame 1 for soldering, not to mention, the adjustment of the amount of soldering material etc. The state of the connector fixed is shown in FIGS. 8 and 9.

Figure 1:
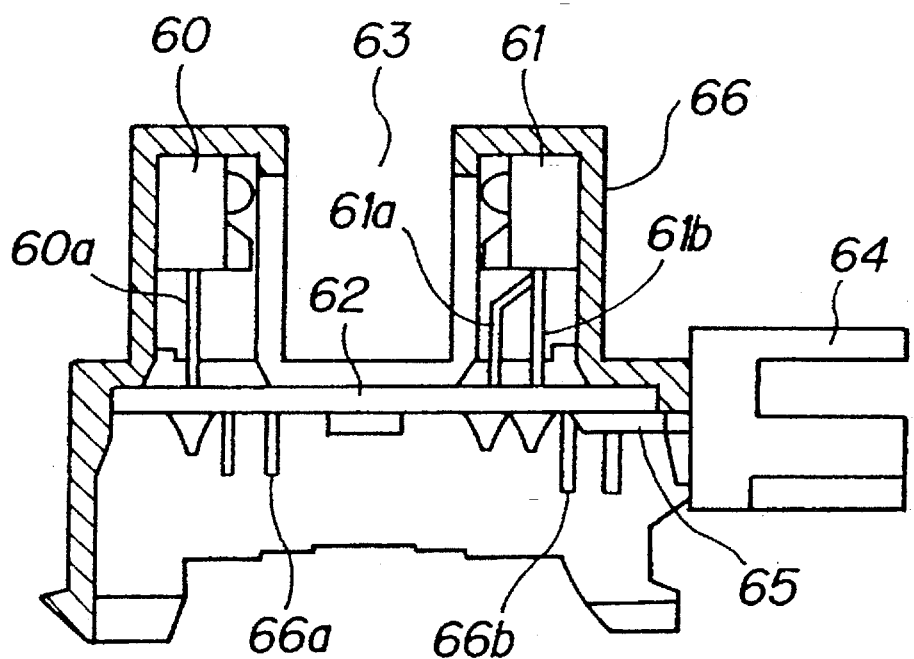
FIG. 1 is a sectional view showing a configuration of a prior art photo interrupter.

As apparent from the manufacturing steps heretofore, since both the light-emitting element 21 and the light-receiving element 31 is provided on the common lead frame 1 having connecting parts to be joined to the connector, no print board used in the prior art configuration (designated at 62 in FIG. 1) is needed, therefore, there is no need for either setting or soldering of the light-emitting-side transparent resin part (60) and the light-receiving-side transparent resin part (61) onto the print board 62. Further, since the use of the lead frame in the invention enables the light sensing part to be joined to the pins 41b to 43b of the connector 4 by welding, this can not only simplify the connecting work but also improve physical strength and thermal resistance of the device.

Figure 10:
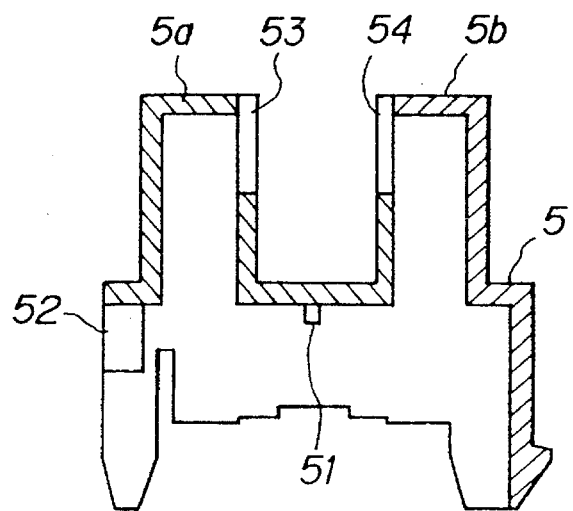
FIG. 10 is a sectional view showing a configuration of a casing.

Next, the light sensing part including the lead frame 1 is assembled into the casing 5. FIG. 10 shows a sectional structure of the casing 5. This casing 5 is formed of a molding with a colored thermoplastic resin so as to block light, and has a light-emitting-element holding portion 5a and a light-receiving-element holding portion 5b both resin-molded. The holding portions 5a and 5b for a light-emitting element and a light-receiving element have windows 53, 54 respectively, in order to allow light beams to be emitted and received between the light-emitting element 21 and the light-receiving element 31. Provided in the middle on the underside of the casing 5 are a pair of melt pins 51. These melt pins 51 are fitted into holes (11 in FIG. 6A) in the lead frame 1, thereafter, pressed with heat, whereby the casing 5 is fixed to the lead frame 1. Another set of melt pins 52 is provided for the casing 5 on the edge to which the connector 4 is jointed. After fitted into the gaps between connecting parts 41a, 42a and 43a for the connector, the melt pins 52 are heat-pressed and fixed. This further makes firm the joint between the lead frame 1, the connector 4 and the casing 5. Here, although the entire part of the casing is formed with a thermoplastic resin in this embodiment, only the melt pins 51 and 52 are essential part to be made from thermoplastic resin, and all the other part can be formed of the other kind of resin. For instance, a thermoplastic resin is used for forming the melt pins only while the other part of the casing may be formed of another resin having resistance to heat.

Figure 11:
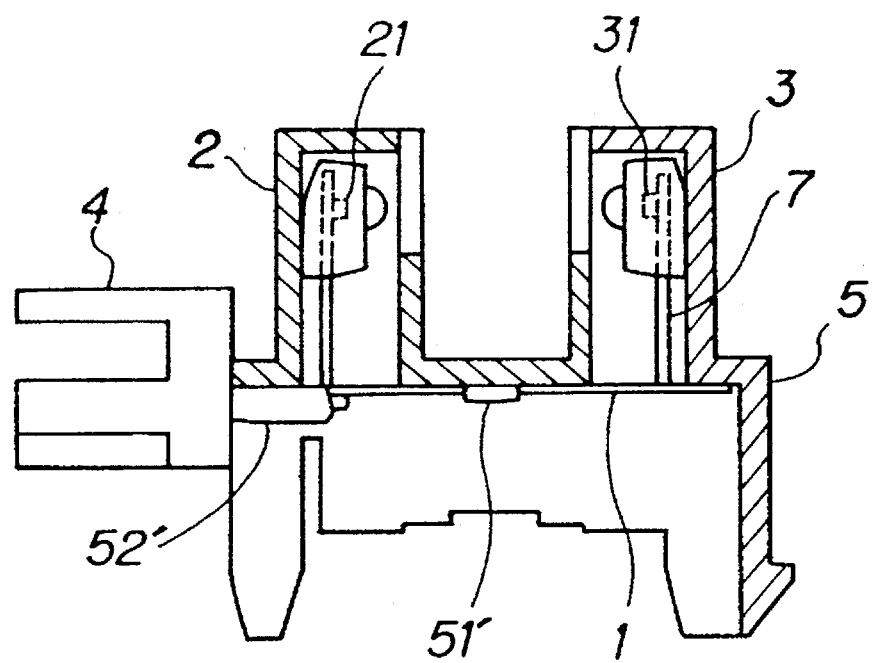
FIG. 11 is a sectional view showing a configuration of a photo interrupter in accordance with an embodiment of the present invention.

In this manner, assembly of the photo interrupter is completed. FIG. 11 shows a sectional configuration of the assembled photo interrupter of the present invention. In the figure, reference numerals 51' and 52' denote the melt pins which have been heat-pressed.

In the above embodiment, the fixture between the casing 5 and the lead frame 1 as well as the fixture among the casing 5, the lead frame 1 and the connector 4 are done by the heat-pressing using a thermoplastic resin, but these joints can be done with an adhesive unless the casing is composed of any thermoplastic resin. Further, it is possible to use a thermoplastic resin for forming the melt pins only while the other part of the casing may be formed with another resin without thermoplasticity.

As has been described, according to the present invention, since the light-emitting element and the light-receiving element are provided on a common single lead frame and the lead frame has a complete interconnecting pattern inclusive of the connecting parts for the connector, it is possible to markedly reduce the number of parts for assembly and therefore to reduce the steps of assembling. As an example, there is no more need for either mounting or soldering the light-emitting-side transparent resin body and the light-receiving-side transparent resin body onto the print board. Further, the reduction in the number of places to be soldered contributes to simplifying the visual check of the assembly.

Further, according to the present invention, since the connector is jointed also to the casing, the connector can be held more firmly than in the conventional configuration in which the connector is held only by the lead frame. This feature contributes to preventing the connected portion between the lead frame and the connector from being bent or broken.

Still more, according to the present invention, since the joint between the casing and the lead frame as well as the joints with the outside parts such as the connector is performed by heat-pressing using a thermoplastic resin, there is no need to provide any joint or fastening with a complicated structure such as hooks etc. Therefore, the structure of the joint portions can be simplified. Since there is no joint using fitting such as hooks etc. but, all the joints are performed by heat-pressing, the jointing can be quite simplified.

Moreover, according to the present invention, since no plating treatment is required for jointing the lead frame with the connector or for providing rust-resistance for the parts, the plating treatment during manufacturing can be omitted.

Finally, according to the present invention, it is possible to provide both the light-emitting element and the light-receiving element on the common lead frame having interconnecting patterns and mold them at the same time so that the different steps such as molding, interconnecting can be done together. Therefore, it is possible to improve work efficiency as well as to reduce the number of the processing apparatuses used. As to the connection of the lead frame with the connector, the connecting terminals are collected in a single site on one side of the lead frame, resulting in improved workability.

What is claimed is:

1. A photo interrupter comprising:
   a light-emitting element;
   a light-receiving element;
   a lead frame having both said light-emitting element and said light-receiving element located thereon;
   a casing covering said light-emitting element, said light-receiving element and said lead frame; and
   a connector attached to said casing, wherein said lead frame includes a lead pattern including a bent portion, for connecting input/output terminals of both said-light emitting element and said light-receiving element, said lead pattern in direct physical and electrical contact with said connector.

2. The photo interrupter according to claim 1 wherein said casing includes joint portions for joining said casing to said connector.

3. The photo interrupter according to claim 1 wherein said casing includes joint portions consisting of a thermoplastic resin, said joint portions located adjacent to said lead frame, and said connector, so that said joint portions provide heat-pressed joining means for connection to said lead frame and said connector.

4. The photo interrupter according to claim 2 wherein said joint portions are thermoplastic resin located adjacent to said lead frame, and said connector.

5. The photo interrupter according to claim 1 wherein said lead frame consists of a conductive material having rust-resistance and said lead frame is joined to said connector by welding.

6. The photo interrupter according to claim 2 wherein said lead frame consists of a conductive material having rust-resistance and said lead frame is joined to said connector by welding.

7. The photo interrupter according to claim 3 wherein said lead frame consists of a conductive material having rust-resistance and said lead frame is joined to said connector by welding.

8. A photo interrupter according to claim 4 wherein said lead frame consists of a conductive material having rust-resistance and said lead frame is joined to said connector by welding.

9. A method of manufacturing a photo interrupter comprising the steps of:
   (a) providing a lead frame having a lead pattern for connecting a light-emitting element and a light-receiving element to be placed thereon so that input/output terminals of the elements may be connected to a connecting member;
   (b) providing a light-emitting element and a light-receiving element on said lead frame;
   (c) molding said elements with a light transmissive resin;
   (d) bending said lead frame so that said light-emitting element and said light-receiving element are opposed to each other;
   (e) connecting a connector to said lead frame by welding;
   (f) holding said lead frame in a casing; and
   (g) joining said lead frame with said casing by heat-pressing.

10. The method of claim 9, wherein said casing includes a first set of thermoplastic melt pins and said lead frame includes holes, wherein step (g) includes placing said first set of thermoplastic melt pins in said holes before heat pressing.

11. The method of claim 10, wherein said casing includes a second set of thermoplastic melt pins and further including a step of heat pressing said second-set of thermoplastic melt pins adjacent said lead frame and said casing, so that a firmer joint is formed between said casing, said lead frame and said connector.

12. The photo interrupter according to claim 1, wherein said lead frame includes means for securing said lead frame to said casing.

13. The photo interrupter according to claim 12, wherein said means includes holes, so that melt pins on the casing can be placed in said holes for heat pressing said casing to said lead frame.

14. The photo interrupter according to claim 1, wherein said casing includes two sets of melt pins.

* * * * *